US011320611B2

(12) United States Patent
Qian et al.

(10) Patent No.: US 11,320,611 B2
(45) Date of Patent: May 3, 2022

(54) SURFACE MOUNTING TECHNIQUES FOR FIBER OPTICS PRINTED CIRCUIT BOARD ASSEMBLIES USING METAL COATINGS AND TABS

(71) Applicant: FINISAR CORPORATION, Sunnyvale, CA (US)

(72) Inventors: Qing Qian, Shanghai (CN); Wei Li, Shanghai (CN); Hui Juan Yan, Shanghai (CN); Hui Yang, Shanghai (CN); Wei Peng Nian, Shanghai (CN); Ting Shi, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/859,752

(22) Filed: Apr. 27, 2020

(65) Prior Publication Data

US 2021/0173158 A1 Jun. 10, 2021

(30) Foreign Application Priority Data

Dec. 4, 2019 (CN) .......................... 201911227814.8

(51) Int. Cl.
*G02B 6/42* (2006.01)
*H05K 1/18* (2006.01)
*H05K 1/02* (2006.01)

(52) U.S. Cl.
CPC ........... *G02B 6/428* (2013.01); *G02B 6/4206* (2013.01); *H05K 1/0274* (2013.01); *H05K 1/181* (2013.01); *H05K 2201/10121* (2013.01)

(58) Field of Classification Search
CPC .... G02B 6/428; G02B 6/4206; H05K 1/0274; H05K 1/181; H05K 2201/10121
See application file for complete search history.

(56) References Cited

U.S. PATENT DOCUMENTS

| 8,194,182 | B2 * | 6/2012 | Kinoshita | G03B 17/00 |
| | | | | 348/374 |
| 9,648,742 | B2 * | 5/2017 | Tazarine | H05K 1/145 |
| 10,555,415 | B2 * | 2/2020 | Herrmann | H05K 1/028 |
| 10,790,254 | B2 * | 9/2020 | Huang | H01L 21/563 |
| 10,816,741 | B2 * | 10/2020 | Chen | H05K 3/0026 |
| 10,985,125 | B2 * | 4/2021 | Huang | H01L 24/17 |

(Continued)

OTHER PUBLICATIONS

Reference number list for U.S. Patent Application Publication No. 2020/0371301 of Chen et al. (Chen) (Year: 2021).*

(Continued)

*Primary Examiner* — Andrew Jordan
(74) *Attorney, Agent, or Firm* — Blank Rome LLP (57) ABSTRACT

The present disclosure generally relates to printed circuit boards or printed circuit board assemblies for fiber optic communications. In one non-limiting embodiment, a method of assembling an optoelectronic assembly includes providing a printed circuit board with a first metal coating and an optical component with a second metal coating. The method further includes positioning the optical component relative to the printed circuit board with at least some portion of the first metal coating aligned with or adjacent to at least some portion of the second metal coating, and applying solder between the first metal coating and the second metal coating to couple the optical component and the printed circuit board.

18 Claims, 7 Drawing Sheets

(56) References Cited

U.S. PATENT DOCUMENTS

| | | | | |
|---|---|---|---|---|
| 2016/0072023 | A1* | 3/2016 | Rudmann | H01L 27/14618 |
| | | | | 438/27 |
| 2016/0324002 | A1* | 11/2016 | Tazarine | H05K 1/181 |
| 2019/0348386 | A1* | 11/2019 | Huang | H01L 23/3135 |
| 2019/0377141 | A1* | 12/2019 | Chen | G02B 6/4244 |
| 2020/0371301 | A1* | 11/2020 | Chen | G02B 6/428 |
| 2021/0005567 | A1* | 1/2021 | Huang | H01L 21/563 |
| 2021/0048593 | A1* | 2/2021 | Wells | H01L 33/62 |
| 2021/0051802 | A1* | 2/2021 | Wells | H05K 1/181 |
| 2021/0173158 | A1* | 6/2021 | Qian | G02B 6/4206 |

OTHER PUBLICATIONS

Reference number list for U.S. Patent Application Publication No. 2019/0348386 of Huang et al. (Huang) (Year: 2021).*

Reference number list for U.S. Patent Application Publication No. 2021/0051802 of Wells et al. (Wells) (Year: 2021).*

Reference number list for U.S. Patent Application Publication No. 2016/0324002 of Tazarine et al. (Tazarine) (Year: 2021).*

Reference number list for U.S. Patent Application Publication No. 2021/0173158 of Qian et al. (Qian, the present application) (Year: 2021).*

* cited by examiner

SURFACE MOUNTING TECHNIQUES FOR FIBER OPTICS PRINTED CIRCUIT BOARD ASSEMBLIES USING METAL COATINGS AND TABS

CROSS-REFERENCE TO RELATED APPLICATIONS

This application claims priority to Chinese Patent Application No. 201911227814.8, filed Dec. 4, 2019, titled SURFACE MOUNTING TECHNIQUES FOR FIBER OPTICS PRINTED CIRCUIT BOARD ASSEMBLIES, and is incorporated herein by reference in its entirety.

BACKGROUND

The present disclosure generally relates to surface mounting techniques for printed circuit boards or printed circuit board assemblies for fiber optic communications. In particular, the present disclosure relates to techniques for bonding one or more components to a surface of a printed circuit board to facilitate manufacture of optoelectronic assemblies, which may result in improved optoelectronic assemblies that incorporate aspects described herein.

Printed circuit boards (PCBs) mechanically support and electrically connect electrical components using conductive couplings such as traces, tracks, pads and/or other features etched from one or more layers of electrically conductive material, such as copper, attached to one or more layers of a non-conductive substrate. Components are generally soldered onto the PCB to both electrically connect and mechanically fasten them to it. PCBs may be used in optoelectronic assemblies that convert electrical signals to optical signals, optical signals to electrical signals, or both. Optoelectronic assemblies may be used, for example, in fiber optic communication to exchange data at increased rates.

In optoelectronic assemblies that implement PCBs, both electrical and optical components may be coupled to the PCB. However, PCB assemblies with both electrical and optical components may pose various manufacturing challenges that may need to be addressed to effectively produce optoelectronic assemblies.

The claimed subject matter is not limited to embodiments that solve any disadvantages or that operate only in environments such as those described above. This background is only provided to illustrate examples of where the present disclosure may be utilized.

SUMMARY

The present disclosure generally relates to surface mounting techniques for printed circuit boards or printed circuit board assemblies for fiber optic communications. In particular, the present disclosure relates to techniques for bonding one or more components to a surface of a printed circuit board to facilitate manufacture of optoelectronic assemblies, which may result in improved optoelectronic assemblies that incorporate aspects described herein.

The present disclosure also generally relates to modifications to a surface of a printed circuit board (PCB) and to a component which is bonded to the PCB to facilitate manufacture of optoelectronic assemblies, which may result in improved optoelectronic assemblies that incorporate aspects described herein.

In one non-limiting example, a method includes providing a printed circuit board with a first metal coating and providing an optical component with a second metal coating. The method also includes positioning the optical component relative to the printed circuit board with at least a portion of the first metal coating aligned with or adjacent to at least a portion of the second metal coating, and applying solder between the first metal coating and the second metal coating to couple the optical component to the printed circuit board.

In one aspect of this method, the optical component may be attached at a coupling area on the surface of the PCB, and the first metal coating may be positioned at least partially or fully inside of the coupling area. The PCB may also include an optoelectronic component, and the optical component may be optically coupled or optically aligned with the optoelectronic component.

In another aspect of this method, the printed circuit board includes an optoelectronic component and the first metal coating defines a coupling area positioned adjacent to the optoelectronic component. In one form, the coupling area at partially surrounds the optoelectronic component in a plane defined by the printed circuit board, while in another form the coupling area surrounds the optoelectronic component in a plane defined by the printed circuit board. The optical component may be coupled to the printed circuit board at the coupling area, and in one form may at least partially enclose the optoelectronic component when the optical component is coupled to the printed circuit board. The optical component may be a lens optically coupled to the optoelectronic component and, in one form, may also be optically aligned with the optoelectronic component.

In yet another aspect of this method, the optical component is coupled to the printed circuit board in the absence of epoxy or other similar bonding materials. In another aspect, the optical component is a lens, and in one form, the lens may be optically coupled to an optoelectronic component on the printed circuit board. In still another aspect of this method, the first metal coating defines a band positioned on the printed circuit board, and the band has an interior boundary and a peripheral boundary spaced apart from the interior boundary. In one form, the printed circuit board may further include an optoelectronic component and the interior boundary of the band of first metal coating surrounds the optoelectronic component.

In another aspect of this method, providing the printed circuit board with the first metal coating includes applying a metal to the printed circuit board in a predefined pattern. In this or another aspect of the method, providing the optical component with the second metal coating includes applying a metal to at least a portion of the optical component. In one form, the optical component is a lens including a first portion spaced apart from a second portion by a pair of oppositely positioned surfaces, the oppositely positioned surfaces are recessed relative to the first portion and the second portion of the lens, and the metal of the second metal coating is applied to the first portion and the second portion of the lens.

In another embodiment, an optoelectronic assembly includes a printed circuit board including a first metal coating on a surface thereof, and an optical component including a second metal coating. In this embodiment, solder is applied between the first metal coating and the second metal coating and couples the optical component to the printed circuit board.

In one aspect, the optoelectronic assembly also includes at least one optoelectronic component coupled to the surface of the printed circuit board, and the optical component is optically aligned with the optoelectronic component. In one form, the optical component may be a lens. In another aspect, the optoelectronic assembly also includes at least one optoelectronic component coupled to the surface of the printed circuit board, and the first metal coating surrounds the optoelectronic component in a plane defined by the printed circuit board, the optical component is a lens that at least partially encloses the optoelectronic component, and the lens is optically aligned with the optoelectronic component.

This Summary introduces a selection of concepts in a simplified form that are further described below in the Detailed Description. This Summary does not identify key features or essential characteristics of the claimed subject matter, and should not be used as an aid in determining the scope of the claimed subject matter.

DETAILED DESCRIPTION

The present disclosure generally relates to printed circuit boards or printed circuit board assemblies for fiber optic communications. Assemblies that incorporate printed circuit boards (PCBs) may be referred to as printed circuit board assemblies (PCBAs). In particular, the present disclosure relates to surface mounting techniques for PCBs or PCBAs for fiber optic communications. More specifically, but not exclusively, the present disclosure relates to techniques for bonding one or more components to a surface of a printed circuit board to facilitate manufacture of optoelectronic assemblies, which may result in improved optoelectronic assemblies that incorporate aspects described herein.

PCBs may be implemented in optoelectronic assemblies configured for fiber optic communication. Optoelectronic assemblies that implement PCBs may include both electrical and optical components that are coupled to the PCB. However, PCB assemblies with the electrical and optical components may pose various manufacturing challenges that interfere with effective and efficient production of optoelectronic assemblies.

For example, certain optical components such as lenses, may be optically aligned with other optical or optoelectronic components. Therefore the optical components may need to be more precisely positioned and attached to the PCB than electrical components. As indicated above, various components are generally soldered onto the PCB to both electrically connect and mechanically fasten them to the PCB. However, for a variety of reasons, for certain optical components such as a lens, attachment to the PCB with solder has not traditionally been practicable. Therefore, optical components have been attached to the PCB in other manners. However, additional challenges arise in coupling optical components to the PCBs in a cost-effective and robust manner.

In some circumstances, it may be desirable to mechanically couple optical components to the surface of a PCB. In some conventional processes to mechanically couple the optical components to the surface, the PCB may include a substantially smooth surface that is not cleaned. If the surface of the PCB is contaminated, the optical component may not sufficiently bond to the PCB. Furthermore, if the surface of the PCB is contaminated when the optical component is bonded to the PCB, the resulting bond between the PCB and the optical component may be relatively weak. In such circumstances, the bond may break over time, for example, during subsequent processing of the PCB to form the optoelectronic assembly. Additionally, the weak bond may break after the optoelectronic assembly is manufactured, for example, during operation of the optoelectronic assembly. Furthermore, in such circumstances the optoelectronic assembly may fail prematurely because of a weak bond caused by, amongst other things, the contaminants on the surface of the PCB left during manufacturing.

Some PCBAs implement through-hole technology (THT). THT refers to a mounting process for attaching electrical components using leads that extend from the electrical components. The leads are inserted into holes formed in the PCB and soldered to pads on the opposite side of the PCB. Other PCBAs implement surface-mount technology (SMT). SMT is a mounting process in which components are mounted or placed directly onto the surface of the PCBs. SMT components are usually smaller than THT components because they have either smaller leads or no leads at all. Generally, SMT speeds up the manufacturing process when compared to THT. However, use of SMT in some circumstances increases the risk of defects due to component miniaturization and denser packing of components on the PCB. In such circumstances, detecting defects (e.g., contaminants or defective bonds) may also be more difficult. Although both SMT and THT may be implemented in various circumstances, SMT has largely replaced THT in manufacture of PCBAs.

The surface of the PCB may be contaminated during the normal course of manufacturing, for example, during SMT or THT processes. Contaminants such as flux, oil, dust, adhesive, or other contaminants may be deposited on the surface of the PCBs as the PCBs are being formed. Such contaminants may be difficult to detect, during and after manufacturing, and may lead to the weak bonds that are also difficult to detect. For instance, the contaminants may be invisible to the human eye, using a microscope, or using other detection methods. Thus, it may be difficult to determine whether a surface of a PCB is contaminated before bonding. Furthermore, it may be difficult to remove contaminants that are not visible or detectable, and to determine whether or not the contaminants were successfully removed.

Even if the surface of the PCBs does not include contaminants, in some circumstances the PCB may not be well-suited for attaching components to its surface. For example, the surface of the PCB may be relatively smooth, and adhesives may not bond well to these surfaces. Some PCBs may include a solder mask, which is a thin lacquer-like layer of polymer that is applied to the surface of the PCB. The solder mask may be used to protect electrically conductive traces on the PCB from oxidation and to prevent or reduce undesired electrical connections between adjacent conductive traces that are positioned relatively close to one another. The solder mask may also be relatively smooth, and adhesives may form relatively poor bonds with the solder mask, for example, when coupling optical components to the PCB. In addition, environmental conditions such as moisture encountered during attachment of the optical component may also result in bonds that are more vulnerable to failure.

Accordingly, the present disclosure relates to techniques for bonding one or more components to a surface of a printed circuit board which involve a printed circuit board including a first metal coating on a surface thereof, and a component bonded to the printed circuit board and including a second metal coating thereon. Solder is applied between the first and second metal coatings and couples or bonds the component to the printed circuit board.

Aspects described herein may improve bonding between the PCB and components attached to the PCB (e.g., optical components or others) using, for example, metal or metallic surface coatings on the component and the PCB and solder applied between the metal or metallic surface coatings on the component and the PCB. Specifically, bonding between the PCB and a component may be improved because soldering cohesion is more resistant to contamination and moisture than other traditional bonding techniques using epoxy or other similar bonding materials. This may improve the strength of the bonds between the PCB and optical components, which in turn may decrease the likelihood that the bonds will break during and after manufacturing. Furthermore, assemblies implementing the concepts described herein may be less likely to fail prematurely as result of broken bonds between the PCB and attached components. In addition, the metal coating applied to the PCB may facilitate positioning of components to be coupled to the PCB, because the metal coating may indicate where the component should be attached to the PCB. Moreover, use of the techniques disclosed herein may facilitate foregoing other processes for removing contaminants from the PCB such as solvent cleaning, plasma cleaning, etc., each of which may pose a risk of damaging components on the PCB.

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

Figure 1A:
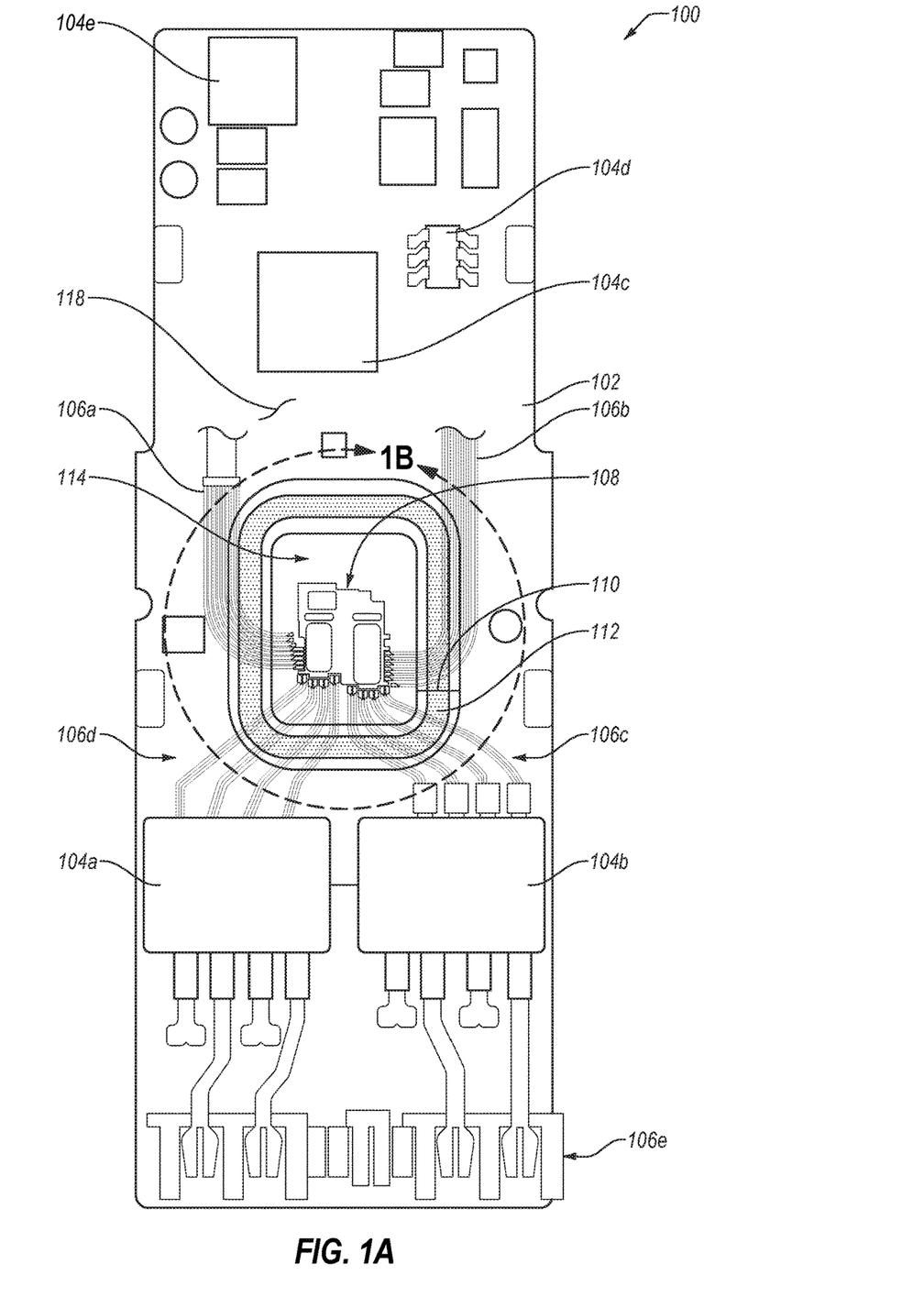
FIG. 1A is a top schematic view of an example printed circuit board assembly (PCBA)

FIG. 1A is a top schematic view of one non-limiting example of a PCBA 100. The PCBA 100 may include a PCB that includes an insulating substrate 102 and a surface 118. Various components, such as electrical components 104a-e, may be positioned on and mechanically coupled to the substrate 102. The electrical components 104a-e may be electrically coupled by conductive couplings 106a-e. The conductive couplings 106a-e may be traces, tracks, pads and/or other features etched from one or more layers of electrically conductive material, such as copper. The electrical components 104a-e may be soldered to electrically and mechanically couple them to the PCBA 100.

The PCBA 100 may include a single layer or multilayer configuration. If the PCBA 100 is a single layer PCB, then it may include one layer of the insulating substrate with conductive couplings positioned on one or both sides. If the PCBA 100 is a multilayer PCB, then it may include multiple layers of insulating substrate, and conductive couplings may be positioned on and/or in between the multiple layers.

In some configurations, the PCBA 100 may include a solder mask, which is a layer applied to the surface 118 of the PCBA 100. The solder mask may be a layer on the surface 118 or proximate the surface 118 of the PCBA 100. The solder mask may protect portions of the PCBA 100, such as the conductive couplings 106a-e. For example, the solder mask may protect the conductive couplings 106a-e from oxidation and to prevent undesired electrical connections between adjacent conductive couplings (e.g., 106a and 106d) that are positioned relatively close to one another.

In some circumstances, when present the solder mask may be applied to the PCBA 100 using a mask or silk-screening technique. The solder mask may be applied as an epoxy liquid through a silkscreen pattern onto the PCBA 100. Additionally or alternatively, the solder mask may be applied using any suitable technique, such as liquid photo-imageable solder mask (LPSM) or dry film photoimageable solder mask (DFSM). Once applied, the solder mask may be cured, for example, using a thermal or ultra violet curing process. Openings may be formed in the solder mask using any suitable process, such as photolithography.

The PCBA 100 may include optoelectronic components 108. In such configurations, the PCBA 100 may be included in an optoelectronic assembly used for fiber optic communication, although the concepts described herein may be implemented in any suitable PCBA. The optoelectronic components 108 may include components related to the conversion of electrical signals to optical signals, optical signals to electrical signals, or both. For example, the optoelectronic components 108 may include a receiver or receiver array configured to receive optical signals and to generate corresponding electrical signals. In another example, the optoelectronic components 108 may include a transmitter or transmitter array configured to receive electrical signals and to generate corresponding optical signals.

The optoelectronic components 108 may include or may be coupled to components related to optical transmitters and receivers. Some examples of the components may include amplifiers (e.g., transimpedance amplifiers, limiting amplifiers, or others), clock and data recovery (CDR) circuits, digital signal processing circuits, drivers, digital-to-analog converter (DAC) circuits, modulators, or other suitable components. In some configurations, such components may be included in the electrical components 104a-e.

As explained above, the optoelectronic assembly may include electrical components 104a-e and/or optoelectronic components 108 coupled to the PCBA 100. The optoelectronic assembly may also include optical components optically coupled or optically aligned to the optoelectronic components 108. The optical components may include lenses, filters, collimators, mirrors, polarizers, or any other suitable component used in optoelectronics. The optical components may be configured to perform an optical function such as direct, focus, collimate, modulate, multiplex, or demultiplex optical signals travelling to or from the optoelectronic components 108.

At least some of the optical components may be mechanically coupled to the PCBA 100. As illustrated, an optical component may be mechanically coupled to the PCBA 100 at coupling area 110. The coupling area 110 may correspond to the size and/or shape of an optical component to be coupled with the PCBA 100. In the illustrated configuration, the coupling area 110 is rectangular and annular (e.g., a rectangular annulus) with rounded corners. The coupling area 110 may correspond to a rectangular optical component that is to be mechanically coupled to the PCBA 100 and optically coupled to the optoelectronic components 108. In other configurations, the coupling area 110 may be any suitable shape or size, and the configuration of the coupling area 110 may depend on the shape and size of the optical component. In the illustrated example, the optical component may include a lens, although any suitable component may be coupled to the PCBA 100 according to the concepts described in this disclosure.

In the illustrated form, the coupling area 110 is defined by a metal coating 112 applied to the surface 118 of the PCBA 100. Similarly, in the illustrated configuration, the metal coating 112 is rectangular and annular (e.g., a rectangular annulus) with rounded corners, corresponding to the coupling area 110. While the metal coating 112 is positioned entirely within and defines the coupling area 110 as shown, other configurations may be implemented where, for example, the metal coating 112 is only included in certain portions within the coupling area 110 such that the coupling area 110 is not entirely filled with the metal coating 112. In one form, the metal coating 112 may overlap or be positioned over the coupling area 110. In another form, the metal coating 112 may be smaller than the coupling area 110. In some configurations, the metal coating 112 may be between about 50% and about 75% of the size of the coupling area 110, although other configurations may be implemented. In other configurations, the metal coating 112 may be substantially the same size or larger than the coupling area 110. It should also be appreciated that the metal coating 112 may be any suitable shape or size, and the configuration of the metal coating 112 may depend on the shape and size of the coupling area 110, the optical component, or both.

The metal coating 112 may be formed or deposited on the surface 118 of the PCB through any suitable process including, for example, atomic layer deposition, physical vapor deposition, or chemical vapor deposition. The process for depositing metal coating 112 should include parameters, such as temperature for example, that avoid damaging the PCB or any components coupled with the PCBA 100 to the extent the metal coating 112 is applied after one or more components have been coupled with the PCBA. The metal coating 112 may include one or more of gold, copper, aluminum, zinc, nickel, iron, and platinum, or an alloy including any one more of these metals. The surface 118 of the PCB may be cleaned or otherwise treated before application of the metal coating 112 to ensure adequate and proper adhesion of the metal coating to the surface 118. Additionally, or alternatively, the PCB may include one or more physical features configured to enhance or promote adhesion of the metal coating 112 to the surface 118. For example, the substrate 102 could include one or more holes or depressions into which the metal coating is applied. Additionally, or alternatively, the surface 118 could be treated to provide a textured or roughened area onto which the metal coating 112 is applied.

Figure 1B:
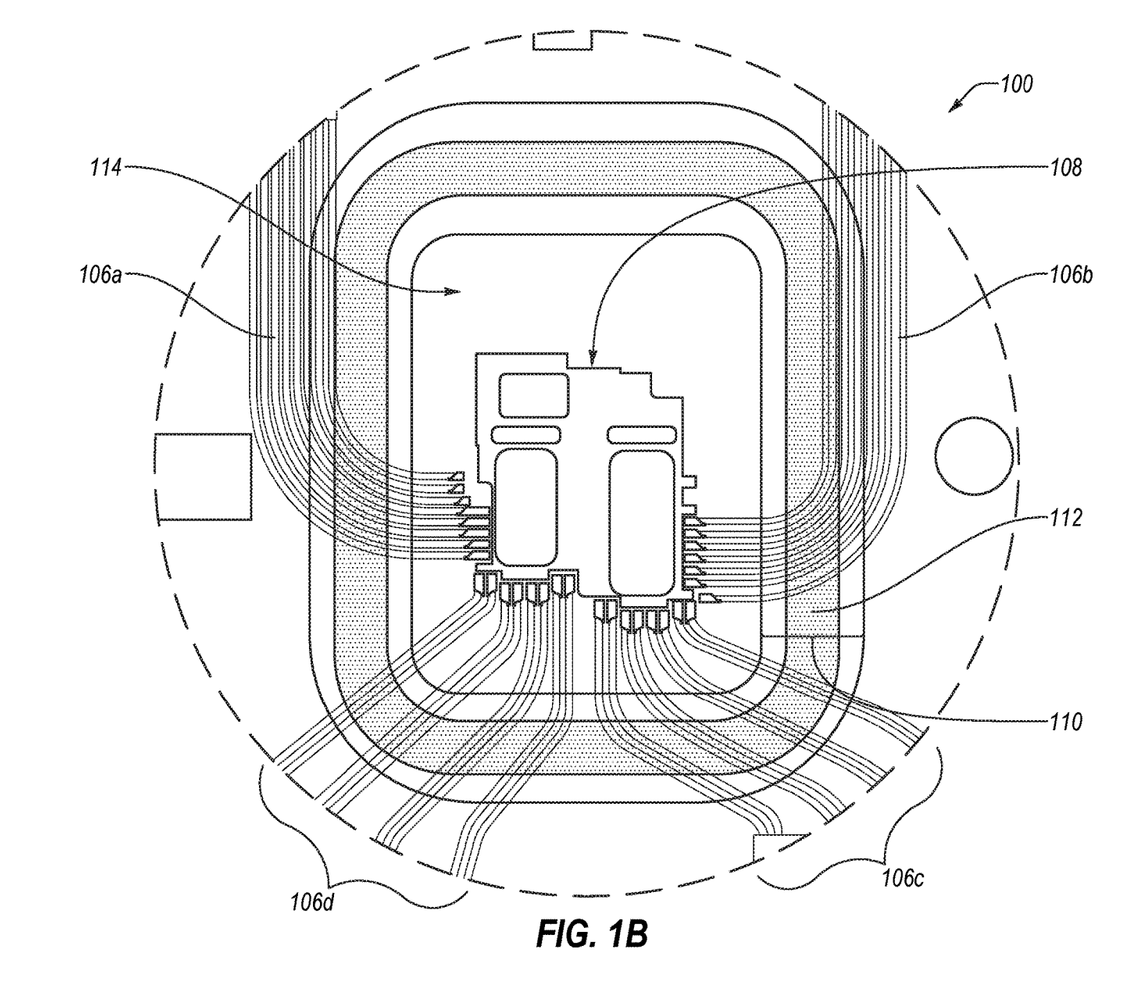
FIG. 1B is a top schematic view of a portion of the PCBA of FIG. 1A.

FIG. 1B is a top schematic view of a portion of the PCBA 100 of FIG. 1A. In particular, FIG. 1B illustrates a portion of the PCBA 100, denoted by circle 1B in FIG. 1A. In FIG. 1B, the optoelectronic components 108, the coupling area 110, and the metal coating 112 are shown in further detail. As introduced above, the metal coating 112 defines and entirely fills the area within the coupling area 110, although forms in which the metal coating 112 only fills one or more contiguous or non-contiguous portions of the coupling area 110 are possible. The optoelectronic components 108 may be electrically coupled to other components of the PCBA 100 with conductive couplings 106a-d.

As mentioned, the optical component may include a lens. In some configurations, the optical component may partially or wholly enclose the components positioned in an area 114 inside of the coupling area 110. For example, the optical component may define a cavity to enclose the optoelectronic components 108 between the optical component and the PCB of the PCBA 100. In such configurations, the optical component may hermetically seal the optoelectronic components 108 or other components positioned in the area 114. The metal coating 112 and/or the coupling area 110 may surround the optoelectronic components 108 in a plane defined by the PCB of the PCBA 100. In addition, the optical component may be optically aligned with the optoelectronic component.

Figure 2:
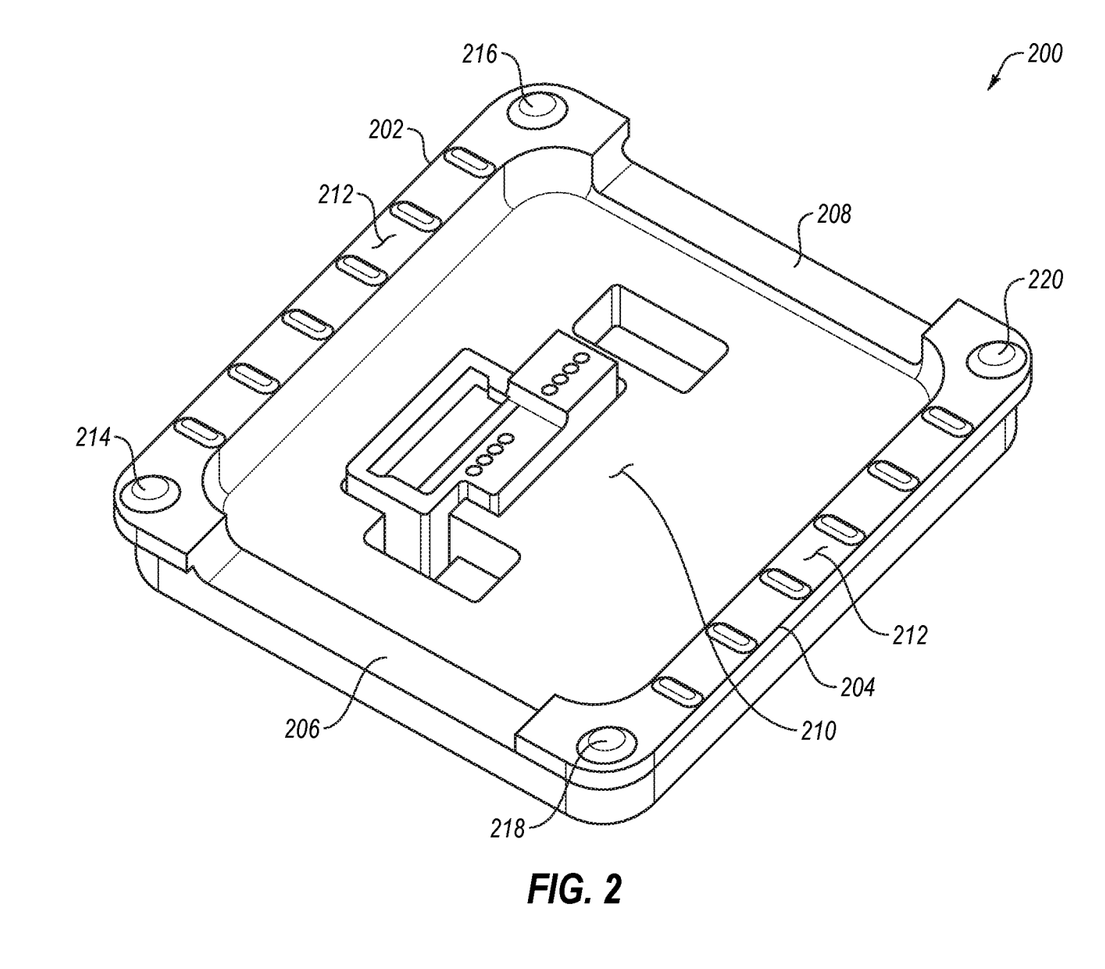
FIG. 2 is a perspective view of a portion of an optical component.

With reference to FIG. 2 for example, there is illustrated one non-limiting form of a lens 200 which may be coupled to PCBA 100. FIG. 2 illustrates a perspective view of a lower portion of lens 200 which faces the PCB of the PCBA 100 when the lens 200 is coupled therewith. The lens 200 includes a first portion 202 positioned opposite and spaced apart from a second portion 204. Oppositely positioned surfaces 206 and 208 are positioned between and space the first and second portions 202, 204 from one another. The lens 200 also includes a hollow interior or cavity 210 in which one or more components positioned on the PCBA 100 may be positioned when the lens 200 is coupled with the PCBA 100. In this arrangement, the cavity 210 of the lens 200 may enclose the optoelectronic components 108 between the lens 200 and the PCB of the PCBA 100. In the illustrated form, the surfaces 206, 208 are recessed relative to the surfaces of the first and second portions 202, 204 such that the optoelectronic components 108 are only partially enclosed within the cavity 210 of the lens 200 when the lens 200 is coupled to the PCB of the PCBA 100. In other forms however, the surfaces 206, 208 may be flush with the surfaces of the first and second portions 202, 204 such that the optoelectronic components 108 are wholly enclosed within the cavity 210 of the lens 200 when the lens 200 is coupled to the PCB of the PCBA 100.

The lens 200 also includes tabs or projections 214, 216 which are positioned on the first portion 202, and tabs or projections 218, 220 which are positioned on the second portion 204. The projections 214, 216, 218 and 220 may be received in corresponding apertures (not shown) in the PCB of the PCBA 100 to facilitate, amongst other things, proper positioning of the lens 200 on the PCB. However, alternative forms where the projections 214, 216, 218 and 220 are not present are also possible. Each of the first and second portions 202 and 204 includes a metal coating 212. The metal coating 212 may be formed or deposited on the first and second portions 202, 204 of the lens 200 through any suitable process including, for example, atomic layer deposition, physical vapor deposition, or chemical vapor deposition.

The process for depositing metal coating 212 should include parameters, such as temperature for example, that avoid damaging the lens 200. The metal coating 212 may include one or more of gold, copper, aluminum, zinc, nickel, iron, and platinum, or an alloy including any one more of these metals. The first and second portions 202, 204 of the lens 200, or other areas where the metal coating 212 is applied, may be cleaned or otherwise treated before application of the metal coating 212 to ensure adequate and proper adhesion of the metal coating 212 to the lens. Additionally, or alternatively, the lens 200 may include one or more physical features configured to enhance or promote adhesion of the metal coating 212. For example, the lens 200 could include one or more holes or depressions into which the metal coating 212 is applied. Additionally, or alternatively, the lens 200 could be treated to provide a textured or roughened area onto which the metal coating 212 is applied.

Generally speaking, in the illustrated form of the lens 200, the metal coating 212 entirely covers the first and second portions 202, 204 of the lens 200. However, in other non-illustrated forms, it should be appreciated that the metal coating 212 may only cover one or more portions of the first and second portions 202, 204, such that at least some portion of the first and second portions 202, 204 remains free of the metal coating. Moreover, in forms where the surfaces 206, 208 are flush with the first and second portions 202, 204, the metal coating 212 may also be applied to all or part of the surfaces 206, 208. As such, forms in which a continuous ring of the metal coating 212 is applied to the lens 200 are possible, as well as forms where the metal coating 212 has a general ring-like shape but the metal coating is not continuous. For example, in this latter form, spacing could occur between separate portions of the metal coating.

Figure 3:
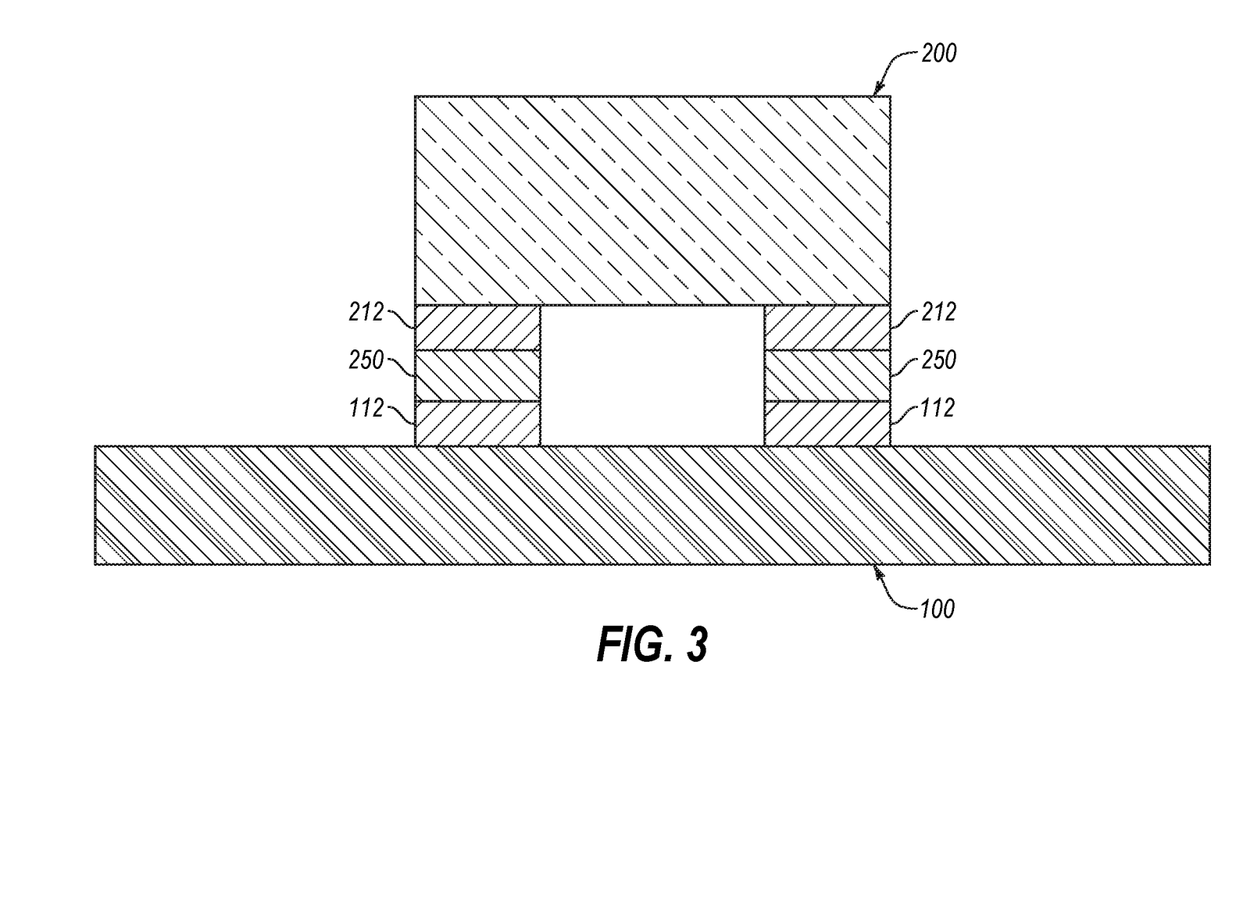
FIG. 3 is a schematic illustration of a technique for coupling the optical component of FIG. 2 to the PCBA of FIG. 1.

FIG. 3 provides a schematic illustration of one technique for coupling or mounting the lens 200 or another optical component to the PCBA 100. More specifically, with the metal coating 112 applied to the surface 118 of the PCBA 100 and the metal coating 212 applied to the lens 200, the lens 200 may be positioned relative to the PCBA 100 with the metal coating 212 aligned with the metal coating 112. In the illustrated form, the metal coating 212 is generally positioned directly over and inline with the metal coating 112. However, forms where the metal coating 212 is not directly or entirely aligned with the metal coating 112 are also possible. Once the components have been properly aligned, solder 250 may be applied between the metal coatings 112, 212 in order to bond the lens 200 to the PCBA 100. The solder 250 may be applied using any suitable technique and under conditions which do not damage the PCBA 100 or the lens 200 or other optical component. For example, in one form the solder 250 may have a melting temperature which is less than a temperature which would cause damage to the lens 200 or other optical components. In this respect, the solder 250 may melt and/or become flowable at a temperature which is less than a temperature that causes different solder used to coupled other components to the PCBA 100 to melt and/or become flowable. It is also contemplated that the same solder could be used to couple the lens 200 and the other components to the PCBA 100.

By way of example, in one form a reflow soldering technique may be utilized where a solder paste is used and the lens 200 and other components may be temporarily attached to the PCBA 100. Thereafter, the entire PCBA 100 is heated causing solder 250 from the solder paste to flow in a molten state between the PCBA 100 and the lens 200, and other components, and create permanent solder joints. It is also possible to use a reflow soldering technique to attach the lens 200 or other optical component after the other components have been coupled or attached to the PCBA 100. For example, in some circumstances a lower melt temperature solder material may be used to attach the lens 200 or other optical component(s) to the PCBA 100 in order to avoid damaging the lens 200 or other optical component(s). In these instances, it is possible that a higher temperature solder could be used first to attach the other components to the PCBA 100, followed by coupling of the lens 200 with the lower temperature solder because heating the PCBA 100 will be done at a temperature below that which causes the other solder to flow in a molten state. Stated alternatively, the PCBA 100 will not be heated to a temperature high enough to affect the permanent solder joints between the PCBA 100 and other components attached thereto.

While not previously discussed, it should be understood that during operation components of an optoelectronic transceiver module may produce and emit electromagnetic fields, or electromagnetic interference ("EMI"). EMI may interfere with the operation of other components within and/or external to the optoelectronic transceiver module, particularly while the components operate at high frequencies. In one form for example, the metal coatings 112 and 212, as well as the solder 250 positioned between the metal coatings 112 and 212, may provide EMI attenuating effects and reduce the effects of EMI produced during operation of the PCBA 100. Similarly, in one form, one or more of the metal coating 112, metal coating 212 and solder 250 are selected or designed in a manner that enhances EMI attenuating effects.

Figure 4A:
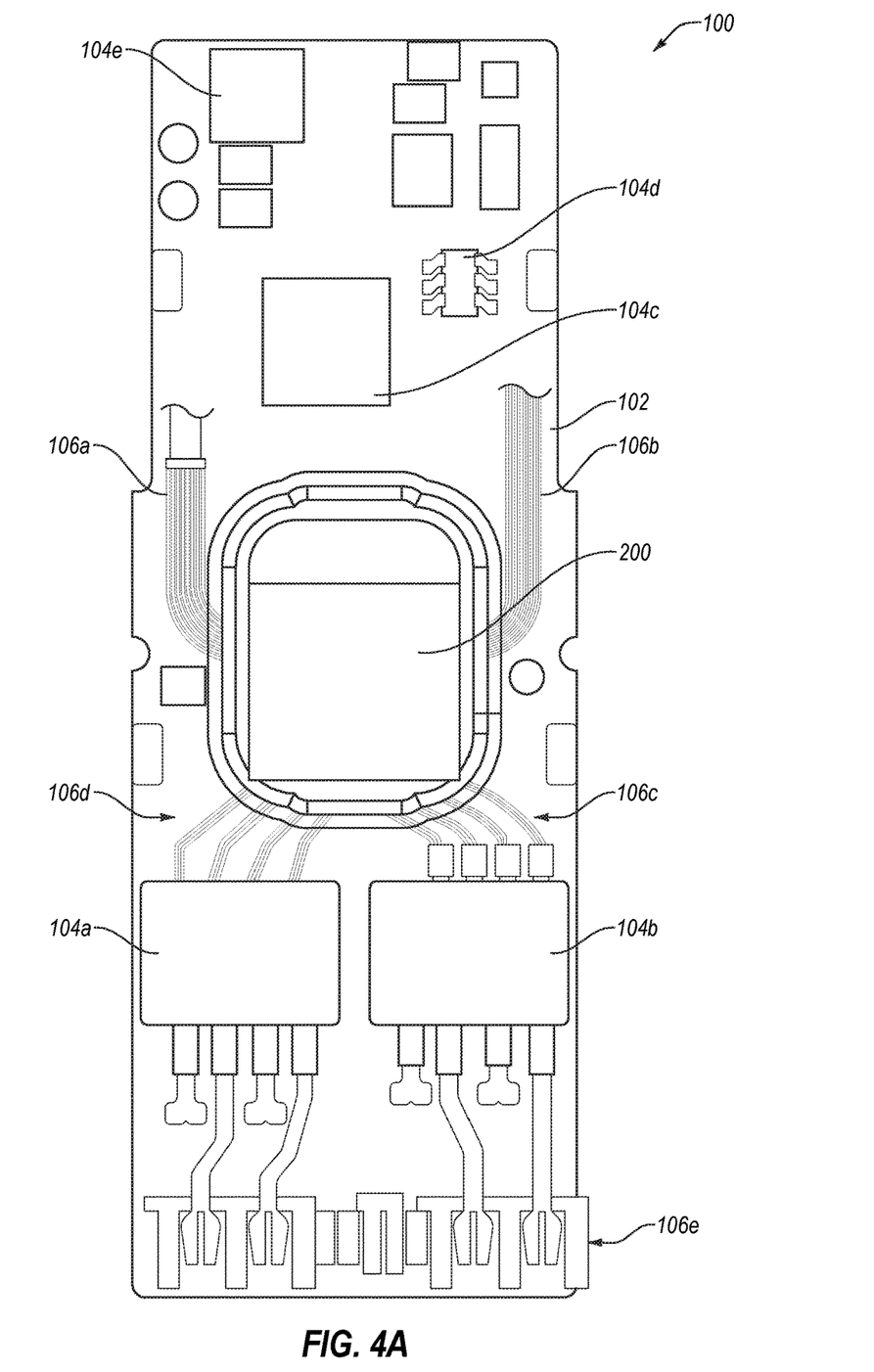
FIG. 4A is a top schematic view of the PCBA of FIG. 1A with the optical component of FIG. 2.
Figure 4B:
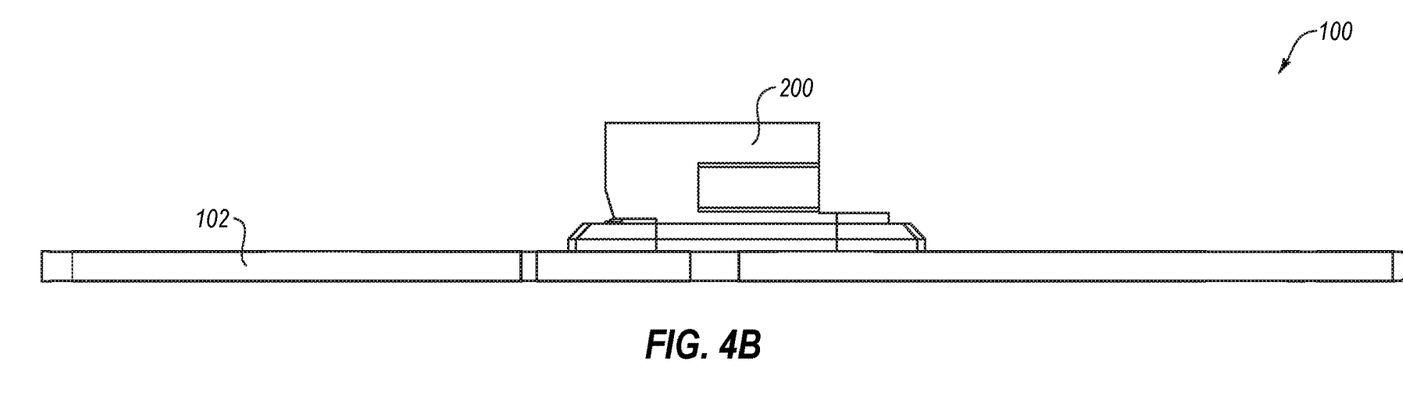
FIG. 4B is a side schematic view of the PCBA of FIG. 4A.

FIGS. 4A-4B illustrate an optical component 200 coupled to the surface of the PCBA 100. In particular, FIG. 4A is a top schematic view of the PCBA 100 with the optical component 200 and FIG. 4B is a side schematic view of the PCBA 100 with the optical component 200. In some configurations, the optical component 200 may be coupled to the surface of the PCBA 100 at an area including metal coating 112. In some configurations, the optical component 200 may be a lens, although the concepts described herein may be applied to other types of components. The optical component 200 may be attached at a coupling area on the surface of the PCBA 100, and the metal coating 112 may be positioned at least partially or fully inside of the coupling area. In some circumstances, the optical component 200 may be optically aligned with one or more optoelectronic component coupled to the surface.

In some configurations, the optical component 200 may at least partially enclose optoelectronic components, such as the optoelectronic components 108 of FIG. 1A, after the optical component 200 is coupled to the PCBA 100. Additionally, or alternatively, the optical component 200 may hermetically seal optoelectronic components in between the PCBA and the optical component 200. Accordingly, the optoelectronic components 108 of FIG. 1A may be hermetically sealed between the PCBA 100 and the optical component 200 after the optical component 200 is coupled to the PCBA 100. The optical component 200 may be a lens optically coupled or optically aligned to the optoelectronic components 108.

Figure 5:
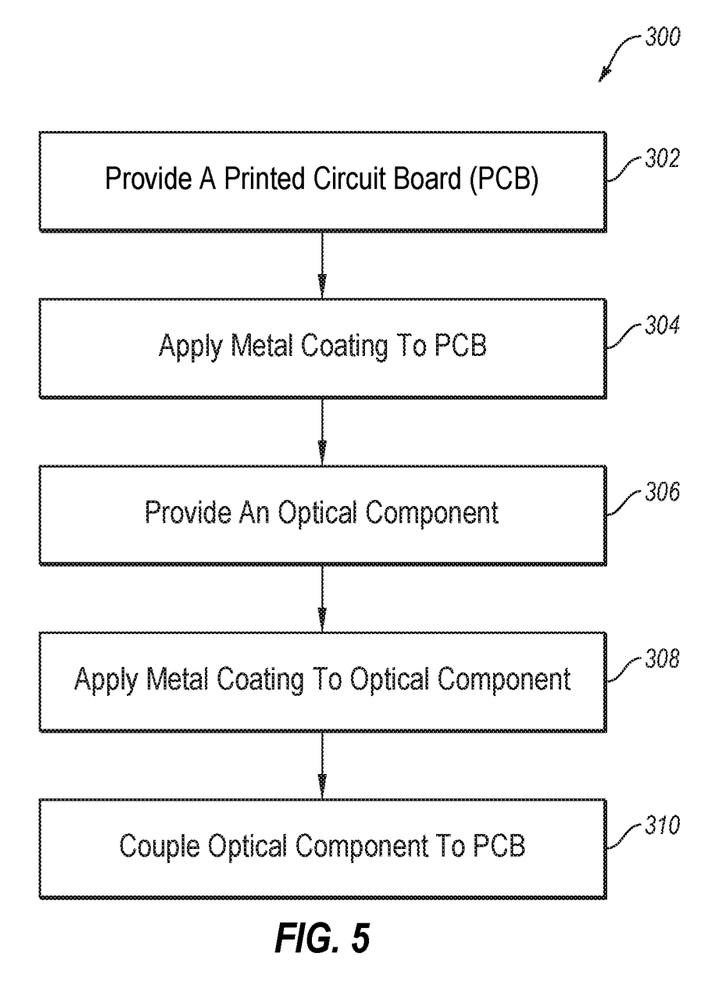
FIG. 5 is a flow chart of an example method for coupling an optical component to a PCBA.

FIG. 5 is flow chart of an example method 300 of forming a PCBA. The method 300 may be implemented in construction of an assembly that includes a PCB such as the PCBA 100 of FIGS. 1A-1B or 4A-4B. Although illustrated as discrete blocks, various steps in FIG. 5 may be divided into additional steps, combined into fewer steps, or eliminated, depending on the desired implementation.

The method 300 may begin at step 302 where a printed circuit board is provided. In step 302, the printed circuit board may be provided with conductive couplings, one or more components coupled with the substrate thereof, and/or other features. However, step 302 may also include certain processing or assembling of the printed circuit board. For example, step 302 may also include forming conductive couplings on a surface of a substrate. For instance, referring to FIGS. 1A-1B, the conductive couplings 106a-e may be formed on a surface of the substrate 102. Any suitable configuration may be used for forming the conductive couplings. For example, a layer of conductive material, such as copper, may be positioned over the substrate, which may be non-conductive. The conductive material may be etched or otherwise processed to remove a portion of the conductive material, and the remaining conductive material may form the conductive couplings on the surface of the substrate.

Step 302 may also include electrically coupling one or more components to the surface of the substrate. In some configurations, the components may be electrical components and/or optoelectronic components. For example, referring to FIGS. 1A-1B, the electrical components 104a-e and/or the optoelectronic components 108 may be coupled to the surface 118 of the substrate 102. Accordingly, at least one optoelectronic component may be coupled to a surface of the PCB. In some configurations, the components may be soldered to the conductive couplings of the PCB, thereby mechanically coupling the components to the PCB and electrically coupling the electrical components to the conductive traces.

It should be appreciated that step 304 could be combined with step 302 of method 100. Moreover, like step 302 described above, the PCB could also be provided at step 302 with the metal coating already applied thereto.

At step 304, assuming the PCB is not provided at step 302 with the metal coating, a metal coating is applied to the PCB using techniques described herein above. In one form, application of the metal coating may be manually or automatically controlled using a controller. The controller may specify where on the substrate or the PCB the metal coating is applied. For example, the pattern or area of the metal coating as applied to the PCB may correspond to a predetermined pattern programmed into the controller. As such, a pattern may be pre-selected such that the metal coating is applied in that particular pattern. In some configurations, it may be possible to accurately control application of the metal coating to specific areas on the surface of the substrate or the PCB. In one form, the color or texture of the metal coating may appear different than other areas of the PCB which may, for example, facilitate positioning of components to be coupled to the surface because the metal coating may indicate where the component should be attached to the surface.

At step 306 an optical component is provided. At step 308, a metal coating may be applied to a portion of the optical component in accordance with the techniques previously described herein. However, it should be appreciated that the optical component may be provided at step 306 with the metal coating already applied thereto.

At step 310, the optical component is coupled to the PCB in accordance with the techniques described herein. For example, the optical component may be positioned with the metal coating thereof at least partially aligned with the metal coating on the PCB and solder may be applied between the metal coatings in order to couple the optical component and the PCB. The optical component may be coupled to the surface with at least some portions of the metal coatings overlapping in a manner that facilitates effective soldering therebetween. In some configurations, the optical component may be a lens, although the concepts described herein may be applied to other types of components as well. In one form, the metal coating on the PCB may be positioned at least partially or fully inside of optical component. In some circumstances, the optical component may be optically aligned with one or more optoelectronic component coupled to the surface.

In some configurations, the optical component may at least partially enclose the optoelectronic component(s) after the optical component is coupled to the PCB. Additionally or alternatively, the optical component may hermetically seal the optoelectronic component(s) in between the PCB and the optical component. Accordingly, the optoelectronic component(s) may be hermetically sealed between the PCB and the optical component after the optical component is coupled to the PCB.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

In some configurations, the PCBA 100 of FIGS. 1A-1B and 4A-4B may be implemented in optoelectronic assemblies that implement PCBAs. For example, the PCBA 100 may be implemented in optoelectronic modules for use in transceivers, transmitter optical subassemblies (TOSAs), receiver optical subassemblies (ROSAs), active optical cables, and others. In some configurations, the optoelectronic modules may comply with the Gen4 QSFP or Gen4 QSFP+ form factor.

In some circumstances, use of the metal coatings on the printed circuit board and the optical component and a solder connection therebetween may be improve the bond between the component and the printed circuit board. Furthermore, the configurations described herein may be used to avoid weak bonds, formed, for example, by contaminants and/or smooth surfaces of the substrate or PCB.

When the concepts described are implemented to bond optical components to the PCB, the resulting bond may robustly secure the optical component to the PCB. Furthermore, the presence of any contaminants on the surface of the PCB where the optical component is bonded to the PCB may not result in a weak bond. In such circumstances, the bond formed may be stronger and therefore may not break over time. The stronger bond may be useful during subsequent processing of the PCB to form the optoelectronic assembly, because the bond will not break during handling or subsequent processing. Additionally or alternatively, the stronger bond may not break after the optoelectronic assembly is manufactured, for example, during operation of the optoelectronic assembly. Such configurations may also prevent optoelectronic assemblies from failing prematurely because weak bonds caused by contaminants on the surface of the PCB or other factors may be avoided.

The terms and words used in the description and claims are not limited to the bibliographical meanings, but, are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

As used herein, an "electrical component" refers to a component that involves electricity, an "optical component" refers to a component that involves electromagnetic radiation (e.g., visible light or others), and an "optoelectronic component" refers to a component that involves both electrical signals and optical signals, and/or the conversion of electrical signals to optical signals, or vice versa.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. A method of assembling an optoelectronic assembly, comprising:
providing a printed circuit board with a coupling area by applying a first metal coating on a surface of the printed circuit board, the first metal coating having opposing sides surrounding an inside area on the surface of the printed circuit board;
coupling an optoelectronic component to the inside area on the surface of the printed circuit board surrounded by the opposing sides of the first metal coating;
providing an optical component with a second metal coating by applying the second metal coating on opposing edges of the optical component;
positioning the optical component relative to the optoelectronic component on the printed circuit board by positioning the second metal coating on the opposing edges of the optical component aligned with or adjacent to the opposing sides of the second metal coating and facilitating proper positioning using tabs on the opposing edges; and
applying solder in a space between the first metal coating and the second metal coating to couple the optical component to the printed circuit board.

2. The method of claim 1, wherein the coupling area having the opposing sides partially surrounds the optoelectronic component in a plane defined by the surface of the printed circuit board.

3. The method of claim 1, wherein the coupling area having the opposing sides entirely surrounds the optoelectronic component in a plane defined by the surface of the printed circuit board.

4. The method of claim 1, wherein the optical component at least partially encloses the optoelectronic component when the optical component is coupled to the printed circuit board.

5. The method of claim 4, wherein the optical component is a lens optically coupled to the optoelectronic component.

6. The method of claim 5, wherein the lens is optically aligned with the optoelectronic component.

7. The method of claim 1, wherein the optical component is coupled to the printed circuit board in the absence of epoxy.

8. The method of claim 1, wherein the optical component is a lens; and wherein the lens is optically coupled to the optoelectronic component on the printed circuit board.

9. The method of claim 1, wherein the first metal coating defines a band positioned on the printed circuit board, the band having an interior boundary and a peripheral boundary spaced apart from the interior boundary.

10. The method of claim 9, wherein the interior boundary of the band of the first metal coating surrounds the optoelectronic component.

11. The method of claim 1, wherein providing the printed circuit board with the first metal coating includes applying a metal to the printed circuit board in a predefined pattern.

12. The method of claim 1, wherein:
the optical component is a lens including a first of the opposing edges spaced apart from a second of the opposing edges by a pair of oppositely positioned surfaces;
the oppositely positioned surfaces are recessed relative to the first opposing edge and the second opposing edge of the lens; and
the second metal coating is applied to the first opposing edge and the second opposing edge of the lens.

13. The method of claim 1, wherein applying the solder in the space between the first metal coating and the second metal coating to couple the optical component to the printed circuit board comprises at least one of:
using a type of the solder having a melting temperature that is less than a temperature that damages the optical component;
using a type of the solder having a melting temperature that is less than a temperature that damages the printed circuit board;
using a type of the solder having a melting temperature that is lower than another melting temperature of other solder used for the optoelectronic assembly; and
utilizing a paste of the solder, heating the printed circuit board to a melting temperature of the solder; and flowing the solder in a molten state between the printed circuit board and the optical component.

14. An optoelectronic assembly, comprising:
a printed circuit board including a first metal coating applied in a coupling area on a surface thereof, the first metal coating having opposing sides surrounding an inside area on the surface of the printed circuit board;
at least one optoelectronic component coupled to the inside area on the surface of the printed circuit board surrounded by the opposing sides of the first metal coating; and
an optical component including a second metal coating applied on opposing edges of the optical component, the optical component positioned relative to the optoelectronic component on the printed circuit board with the opposing edges of the second metal coating aligned with or adjacent to the opposing sides of the first metal coating, tabs on the opposing edges being configured to facilitate proper positioning on the opposing sides;
wherein solder is applied between in a space between the first metal coating on the opposing sides and the second metal coating on the opposing edges and couples the optical component and the printed circuit board.

15. The optoelectronic assembly of claim 14, wherein the optical component is optically aligned with the optoelectronic component.

16. The optoelectronic assembly of claim 15, wherein the optical component is a lens.

17. The optoelectronic assembly of claim 14, wherein the first metal coating having the opposing sides surrounds the optoelectronic component in a plane defined by the surface of the printed circuit board, the optical component is a lens that at least partially encloses the optoelectronic component, and the lens is optically aligned with the optoelectronic component.

18. The optoelectronic assembly of claim 14, wherein the optical component defines a cavity wholly enclosing the optoelectronic component hermetically sealed therein.

* * * * *